(12) United States Patent
Gebauer et al.

(10) Patent No.: US 6,462,407 B2
(45) Date of Patent: Oct. 8, 2002

(54) ELECTRONIC DEVICE HAVING A MULTIPLICITY OF CONTACT BUMPS

(75) Inventors: Uta Gebauer, Regensburg; Thomas Münch, Laaber; Friedrich Wanninger, Würzburg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/816,928

(22) Filed: Mar. 23, 2001

(65) Prior Publication Data

US 2001/0048159 A1 Dec. 6, 2001

(30) Foreign Application Priority Data

Mar. 23, 2000 (DE) .......................................... 100 14 305

(51) Int. Cl.[7] .............................................. H01L 23/02
(52) U.S. Cl. .................. 257/680; 257/684; 257/698; 257/730; 257/738; 257/773; 257/778; 257/780; 228/180.22
(58) Field of Search ................................ 257/678, 680, 257/684, 692, 698, 730, 737, 738, 765, 773, 780, 784, 786, 781, 690, 778; 361/714, 722; 228/180.22

(56) References Cited

U.S. PATENT DOCUMENTS

| | | | |
|---|---|---|---|
| 5,753,974 A | 5/1998 | Masukawa .................. 257/737 |
| 5,821,608 A | 10/1998 | DiStefano et al. .......... 257/669 |
| 5,895,965 A | 4/1999 | Tanaka et al. ............... 257/668 |
| 6,122,171 A | * 9/2000 | Akram et al. ............... 361/704 |
| 6,144,102 A | * 11/2000 | Amagai ....................... 257/781 |
| 6,175,159 B1 | * 1/2001 | Sasaki ......................... 257/778 |
| 6,268,650 B1 | * 7/2001 | Kinsman et al. ............ 257/691 |
| 2001/0052642 A1 | * 12/2001 | Wood et al. ................. 257/690 |

FOREIGN PATENT DOCUMENTS

| | | | |
|---|---|---|---|
| EP | 0 883 180 A2 | | 12/1998 |
| JP | 2000 216202 | * | 8/2000 |
| JP | 2001 85565 | * | 3/2001 |

* cited by examiner

*Primary Examiner*—David L. Talbott
*Assistant Examiner*—Alonzo Chambliss
(74) *Attorney, Agent, or Firm*—Laurence A. Greenberg; Werner H. Stemer; Ralph E. Locher

(57) ABSTRACT

The invention relates to an electronic device having a multiplicity of contact bumps and an intermediate support. In this case, the intermediate support connects the multiplicity of contact bumps to contact areas of a semiconductor chip via a multiplicity of flat conductors which have contact connecting lugs exposed in a bonding channel window of the intermediate support. The contact areas are configured in the bonding channel window via the bonded contact connecting lugs of the flat conductors. The width of the bonding channel window is increasingly greater with increasing distance from the neutral point of the semiconductor chip.

14 Claims, 1 Drawing Sheet

US 6,462,407 B2

ELECTRONIC DEVICE HAVING A MULTIPLICITY OF CONTACT BUMPS

BACKGROUND OF THE INVENTION

Field of the Invention

The present invention relates to an electronic device having a multiplicity of contact bumps that project from a housing and that are connected via rewiring configurations on an intermediate support and that also connect connecting lugs of the intermediate support to contact areas on a semiconductor chip.

Laterally directed mechanical stresses arise when a flat conductor bonding process is used to electrically and mechanically connect a semiconductor chip that is mounted on an organic intermediate support to conductive structures of the intermediate support material. These laterally directed mechanical stresses arise at a predetermined distance between the microscopically small contact areas on the semiconductor chip and the correspondingly dimensioned contact connecting lugs of the flat conductors of the intermediate support. This is because of the different coefficients of thermal expansion of the joining participants, namely the semiconductor chip and the plastic intermediate support. These laterally directed mechanical stresses, which can lead to cracking in the contact connecting lug up to a complete interruption of the connection, arise in the bonding bridge that includes an overhanging contact connecting lug. These laterally directed mechanical stresses increase with increasing distance between the bonded connection and the neutral point of the semiconductor.

Particularly in the case of semiconductor chips with a row of centrally positioned contact areas, the intermediate support material is open in the region of the contact areas, as a result of which a "bonding channel window" in the intermediate support is kept free of support material. The etched-free conductor circuit pattern of the intermediate support is located in the bonding channel window above the contact areas of the semiconductor chip. During the flat conductor bonding process, these flat conductor structures are interrupted in a targeted manner and then are thermomechanically connected to the contact areas of the semiconductor chip. Since the region of the bonding channel window in the intermediate support is conventionally embodied as a slot with parallel edges, all of the flat conductor transitions to the contact windows are of the same length, irrespective of the size and extent of the semiconductor in the longitudinal direction. This means that at a large distance from the centrally located neutral point of the semiconductor chip, the risk of mechanical overloading during thermal cycling of the electronic device increases, the further away the bonded connection is from the neutral point of the semiconductor chip.

A conventional structure of an electronic device having a multiplicity of contact bumps which project on one side from a housing of the electronic device is shown in FIG. 3. The semiconductor chip 7 has a central row 13 of contact areas 6, only four of which are shown by way of example. The housing 15, whose contours are shown in FIG. 3, has an intermediate support 2 on which the multiplicity of contact bumps 1 is configured. The multiplicity of contact bumps 1 are connected via a multiplicity of flat conductors 3, only one of which is shown by way of example, to contact connecting lugs exposed in the bonding channel window 4 of the intermediate support 2 and to the contact areas 6 of the semiconductor chip 7 which are situated underneath at a fixed distance. In the conventional embodiment of the electronic device, the bonding channel window 4 has edges 10 and 11 that run parallel in the longitudinal direction. The contact connecting lugs 5 of the flat conductors 3 thus have the same lengths within the bonding channel window 4. Since these contact connecting lugs 5 are composed of flat conductor material, they are not round like the formerly customary bonding wires. These contact connecting lugs are thus at extreme risk of cracking if, because of the different expansion coefficients of the semiconductor chip 7 and of the intermediate support 2, the electronic device is exposed to thermal cycling. For bonded connections of this type, the further away a bonded connection, which includes a contact connecting lug of the intermediate support 2 and a contact area 6 of the semiconductor chip 7, is from the neutral point 8 of the semiconductor chip 7, the greater the risk of cracking during thermal cycling of the electronic device. This is because tensile stresses increase in the bonding bridge and load-relieving cracks occur.

SUMMARY OF THE INVENTION

It is accordingly an object of the invention to provide an electronic device which overcomes the above-mentioned disadvantageous of the prior art apparatus of this general type. In particular, it is an object of the invention to provide an electronic device that is constructed to reduce the risk that the bonded connections will crack or break, where these bonded connections include contact connecting lugs and semiconductor contact areas in a bonding channel window of the electronic device.

With the foregoing and other objects in view there is provided, in accordance with the invention, an electronic device, that includes a housing having an intermediate support formed with a bonding channel window having a center. A semiconductor chip has a plurality of contact areas disposed in the bonding channel window of the intermediate support. A plurality of contact bumps are configured on the intermediate support and project from the housing. A plurality of flat conductors have contact connecting lugs exposed in the bonding channel window of the intermediate support and connected to the plurality of the contact areas. The plurality of the flat conductors connect the plurality of the contact areas to the plurality of the contact bumps. The semiconductor chip has a neutral point disposed in the center of the bonding channel window of the intermediate support. The bonding channel window is formed with a width that increases with increasing distance from the neutral point of the semiconductor chip.

The neutral point of the semiconductor chip is configured in the center of the bonding channel window, and the width of the bonding channel window is greater with increasing distance from the neutral point. This electronic device has the advantage that the contact connecting lugs which are subjected to higher loading during thermal cycling of the electronic device, because they are further away from the neutral point of the semiconductor chip, are made longer and the tensile stress is thus reduced on both sides of the neutral axis of the contact connecting lugs. Because of the reduction of these tensile stresses during thermal cycling of the electronic device, the risk of cracking in the contact connecting lugs composed of flat conductor material is reduced to the extent that electronic devices constructed according to the invention withstand a higher degree of thermal cycling.

The bonded contact connecting lugs are usually exposed to extreme thermal cycling as early as in the production process, because the soldering bumps are not furnished until after the bonding process. Therefore, the reject rate when the contact bumps projecting from the housing are finally furnished can also be reduced by the manufactured electronic device. Consequently, the solution according to the invention increases both the productivity of the process for producing the electronic devices and the thermal-cycling resistance of the electronic devices to be supplied.

In accordance with an added feature of the invention, the edges of the bonding channel window are curved in the longitudinal direction, the radius of curvature being a multiple of the semiconductor chip length, preferably three to six times the length. This preferred embodiment advantageously realizes a continuously increasing width of the bonding channel window, with the result that the contact connecting lugs which are the furthest away from the central point of the semiconductor chip are made significantly longer than the contact connecting lugs in the vicinity of the neutral point.

In accordance with an additional feature of the invention, the bonding channel window is extended trapezoidally and symmetrically in its width in both longitudinal directions from the neutral point of the semiconductor chip. This embodiment has the advantage that it can be realized relatively simply since the width of the bonding channel window increases linearly with the length of the bonding channel window from the center.

In accordance with another feature of the invention, the bonding channel window increases from the neutral point up to the edge region of the semiconductor chip in the ratio of the length to half of the width of the intermediate support. This means, for example given a chip support width of 18 mm and a chip support length of 36 mm, that a central bonding channel window width of 0.5 mm in the center extends to 2 mm in the edge region. The contact connecting lug has to bridge about 250 µm in the center and four times that, namely 1000 µm, in the edge region, which increases its deformability and reduces its mechanical stresses during thermal cycling of the electronic device.

In accordance with a further feature of the invention, the contact bumps are configured in rows and columns on the intermediate support, preferably two to six contact bump rows are configured on both sides of the bonding channel window.

Electronic devices designed in this way can connect, with their contact bumps, a significantly higher number of contact areas of a semiconductor chip to, for example, associated pads on a circuit board than has been possible with a hitherto customary system support with lead frame for flat conductors.

In accordance with a further added feature of the invention, the contact areas of the semiconductor chip are configured in a row positioned centrally in the longitudinal direction on the semiconductor chip. This embodiment of the electronic device has the advantage that more favorable heat distributions can be achieved on the semiconductor chip since now active and passive components of the semiconductor chip which generate heat no longer have to be configured in the center of the semiconductor chip. Instead, they can be configured on the edges, at which a larger cooling area is available. The heat generation, which was conventionally concentrated in the center of the semiconductor chip, is thus no longer concentrated at the center of the semiconductor chip, but rather is distributed over the edge regions, thereby simultaneously reducing the internal stresses in the semiconductor chip.

The principle of a central bonding channel window having an increasing width for solving the above problem can also be applied to a plurality of bonding channel windows distributed in the longitudinal and transverse directions on the intermediate support. Therefore, in a preferred embodiment of the invention, a plurality of bonding channel windows are configured in the longitudinal and transverse directions in the intermediate support, the neutral point of the semiconductor chip being configured in a central bonding channel window. A structure of this type is used in the case where the distance between the contact bumps and the neutral point of the semiconductor chip becomes so large that, using just one bonding channel window, the loading caused by thermal cycling can no longer be compensated solely by widening a single bonding channel window. In the case of a plurality of bonding channel windows in the longitudinal and transverse directions of the intermediate support, the width of the bonding channel windows increases from the center to the edge in the longitudinal extent of the bonding channel windows. The increase is dependent on the ratio of the distance of the furthest contact bump to the distance of the nearest contact bump from the respective center of the bonding channel window.

In accordance with a further additional feature of the invention, the contact bumps are formed from solder balls disposed in predefined positions on the intermediate support after bonding the contact connecting lugs onto the contact areas of the semi-conductor chip. The solder balls are heated until they melt in the envisaged positions.

In accordance with a concomitant feature of the invention, the contact connecting lugs have a coating made of a gold alloy, while the contact area of the semiconductor chip is composed of an aluminum alloy. This embodiment has the advantage that during the bonding process, which is preferably carried out by ultrasonic excitation, the gold and aluminum alloys form a eutectic at low temperature, and consequently, a low ultrasonic energy suffices to raise the interface region between gold and aluminum to the eutectic melting point. On account of the flat conductor design of the contact connecting lugs, the frictional area between the contact area of the semiconductor chip and the area of the contact connecting lugs is larger than in the case of wire bonding. This ensures a significantly more stable bonded connection than in the case of conventional flat conductor technology using bonding wires.

Other features which are considered as characteristic for the invention are set forth in the appended claims.

Although the invention is illustrated and described herein as embodied in a electronic device having a multiplicity of contact bumps, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
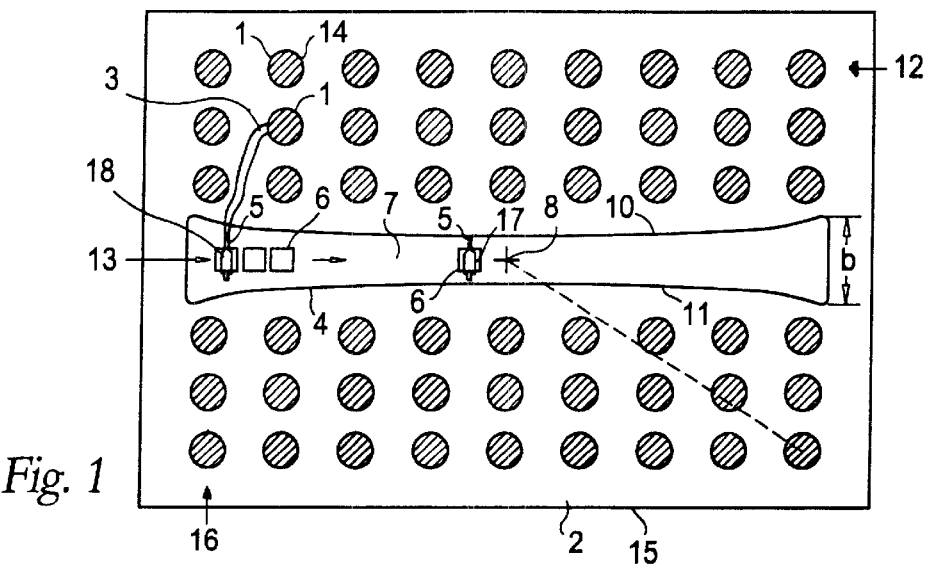
FIG. 1 shows a plan view of the underside of a first embodiment of an electronic device having contact bumps projecting from a housing.

Referring now to the figures of the drawing in detail and first, particularly, to FIG. 1 thereof, there is shown a plan view of the underside of a first embodiment of an electronic device having contact bumps 1 projecting from a housing 15. To that end, the contact bumps 1 are configured in rows 12 and columns 16 on the underside of the electronic housing, in this embodiment three rows 12 in each case are configured symmetrically with respect to a central row 13 of a semiconductor chip 7. The multiplicity of contact bumps 1 is supported by an intermediate support 2, which is a component of the housing 15. Flat conductors 3 are configured on the intermediate support 2 and project with contact connecting lugs 5 into the bonding channel window 4. In the bonding channel window 4, the contact connecting lugs 5 of the flat conductors 3 are bonded onto the contact areas 6 of the semiconductor chip 7. The support material of the intermediate support 2 has been removed in the region of the bonding channel window, with the result that the bonding process can be carried out using ultrasonic bonding technology in row 13 on the semiconductor chip, which is configured below the intermediate support 2 in this view.

The intermediate support 2 with its flat conductors 3 is spaced apart from the semiconductor chip by insulating spaces; this means that the contact connecting lugs 5 form bonding bridges from the level of the intermediate support 2 to the level of the semiconductor chip 7. FIG. 1 represents a centrally bonded connection 17 in the vicinity of the neutral point 8 of the semiconductor chip and shows a bonded connection 18 configured remote from the central point 8 of the semiconductor chip. Since the semiconductor chip 7 and the intermediate support 2 have different expansion coefficients, in the embodiment of the invention shown in FIG. 1, the higher loading of the contact connecting lug 5 of the bonded connection 18 is compensated by extending the width b of the bonding channel window toward the edge of the intermediate support 2. To that end, the edges 10 and 11 of the bonding channel window 4 are curved in the longitudinal direction with a radius of curvature of about three to six times the length of the semiconductor chip.

The contact bumps 1 are preferably formed from solder balls 14 which are formed in predefined positions of the intermediate support 2 after bonding the contact connecting lugs 5 onto the contact areas 6 of the semi-conductor chip 7. The solder balls 14 are heated until they melt in the desired positions.

In this embodiment, the intermediate support 2 has printed circuit pattern geometries and compensation elements for forces which take effect depending on the distance from the neutral point 8 of the semiconductor chip 7. Compensation is advantageously created by virtue of the mechanically vertical fixing of the conductor tracks exposed in the region of the bonding channel window 4 between two fixing points with a defined level difference. Namely, the distance between the flat conductor plane of the intermediate support 2 and the surface of the semiconductor chip 7. The result is that the contact connecting lugs 5 are loaded to a lesser degree even at a large distance from the neutral point of the semiconductor chip 7. This structure of the bonding channel window 4 is particularly suitable for flat conductor bonding since, in contrast to the conventional wire bonding method, a lateral shaping of these printed geometries during the bonding process is possible only to a limited degree in the case of a rectangular flat conductor cross-section. By virtue of the bonding channel geometry adapted to the distance from the neutral point 8 of the semiconductor chip 7, with the embodiment of FIG. 2, degrees of freedom in the x-/y-direction are also possible despite the flat conductor geometry for the contact connecting lugs 5. This is because the bonding bridge is lengthened by the greater distance of the exposed flat conductors from the edges 10 and 11 of the bonding channel window, which simultaneously effects a reduction in the mechanical loading on the bonding bridge.

Figure 2:
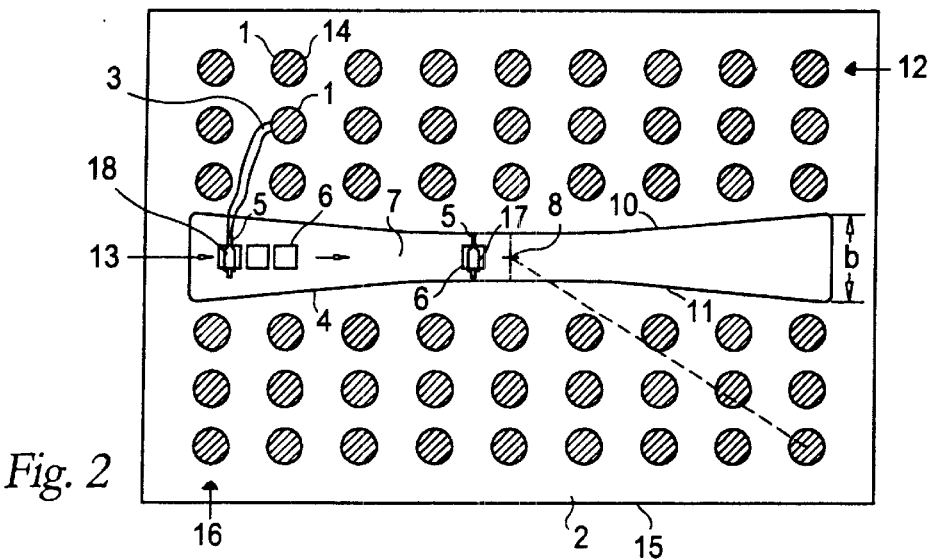
FIG. 2 shows a plan view of the underside a second embodiment of an electronic device having contact bumps projecting from a housing.
Figure 3:
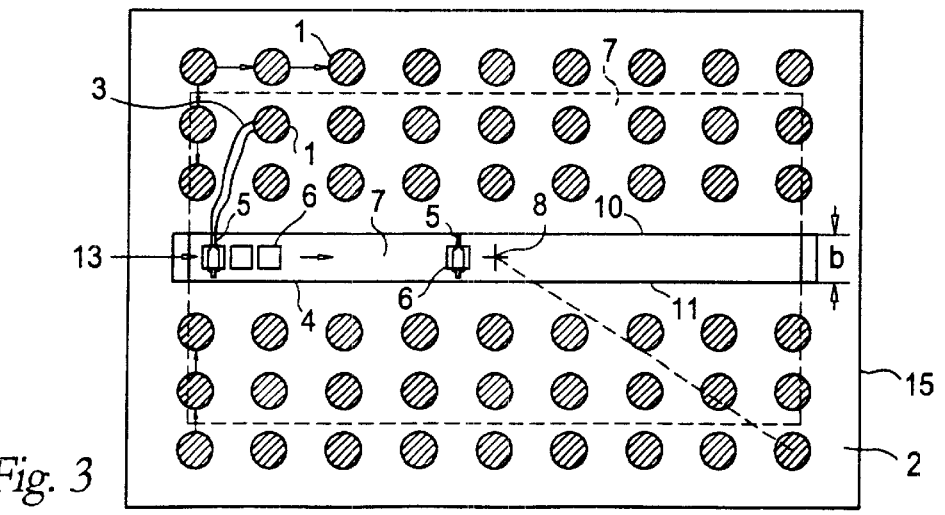
FIG. 3 shows a plan view of the underside of a known conventional electronic device having contact bumps projecting from a housing.

FIG. 2 shows a plan view of the underside of a second embodiment an electronic device having contact bumps 1 projecting from a housing 15. This embodiment of the invention differs from the embodiment shown in FIG. 1 in that the bonding channel window 4 is extended trapezoidally and symmetrically in its width b in both longitudinal directions from the neutral point 8 of the semiconductor chip 7. The width of the bonding channel window 4 increases from the neutral point 8 up to the edge region of the semiconductor chip 7 in the ratio of the length to half the width of the intermediate support 2. Given a size of the intermediate support of, for example, 18 mm width and 36 mm length, the bonding channel window, which is 500 $\mu$m wide at it's center, increases to 2000 $\mu$m toward the edge. The length to be bridged by the contact connecting lugs 5 is slightly less than 250 $\mu$m in the central region and becomes slightly less than 1000 $\mu$m in the edge region. The trapezoidal geometry of the bonding channel window ensures a linear increase in the distance between the edges 10 and 11 from the center toward the edge region, which is in contrast to that of the curved bonding window structure shown in FIG. 1.

We claim:

1. An electronic device, comprising:
    a housing having an intermediate support formed with a bonding channel window having a center;
    a semiconductor chip having a plurality of contact areas disposed in said bonding channel window of said intermediate support;
    a plurality of contact bumps configured on said intermediate support and projecting from said housing;
    a plurality of flat conductors having contact connecting lugs exposed in said bonding channel window of said intermediate support and connected to said plurality of said contact areas, said plurality of said flat conductors connecting said plurality of said contact areas to said plurality of said contact bumps;
    said semiconductor chip having a neutral point disposed in said center of said bonding channel window of said intermediate support; and
    said bonding channel window formed with a width that increases with increasing distance from said neutral point of said semiconductor chip.

2. The electronic device according to claim 1, wherein:
    said semiconductor chip has a length;
    said bonding channel window defines a longitudinal direction and is formed with edges that are curved in said longitudinal direction with a radius of curvature that is a multiple of said length of said semiconductor chip.

3. The electronic device according to claim 2, wherein said multiple is three to six times said length.

4. The electronic device according to claim 2, wherein:
    said semiconductor chip has an edge region, and said intermediate support is formed with a length and a width;
    said width of said bonding channel window increases from said neutral point up to said edge region of said semiconductor chip in a ratio of said length of said intermediate support to half of said width of said intermediate support.

5. The electronic device according to claim 1, wherein:

said bonding channel window defines a first longitudinal direction extending away from said neutral point of said semiconductor chip and a second longitudinal direction extending away from said neutral point of said semiconductor chip; and said width of said bonding channel window increases trapezoidally and symmetrically in said first longitudinal direction and in said second longitudinal direction.

6. The electronic device according to claim 1, wherein:

said semiconductor chip has an edge region, and said intermediate support is formed with a length and a width;

said width of said bonding channel window increases from said neutral point up to said edge region of said semiconductor chip in a ratio of said length of said intermediate support to half of said width of said intermediate support.

7. The electronic device according to claim 1, wherein said plurality of said contact bumps are configured on said intermediate support in rows and columns.

8. The device according to claim 1, wherein:

said bonding channel window is formed with two sides;

said plurality of said contact bumps are configured in a plurality of bump rows; and each one of said two sides of said bonding channel window is adjacent two to six of said plurality of said contact bump rows.

9. The electronic device according to claim 1, wherein:

said semiconductor chip defines a longitudinal direction; and said plurality of said contact areas of said semiconductor chip are configured in a row positioned centrally on said semiconductor chip in said longitudinal direction.

10. The electronic device according to claim 1, wherein:

said intermediate support defines a longitudinal direction and a transverse direction;

said intermediate support is formed with a plurality of bonding channel windows configured in said longitudinal direction and in said transverse direction; and said plurality of said bonding channel windows includes a central bonding window having said neutral point of said semiconductor chip configured therein.

11. The electronic device according to claim 1, wherein:

said semiconductor chip defines a longitudinal direction;

said plurality of said contact areas of said semiconductor chip are configured in a row positioned centrally on said semiconductor chip in said longitudinal direction;

said intermediate support defines a longitudinal direction and a transverse direction;

said intermediate support is formed with a plurality of bonding channel windows configured in said longitudinal direction and in said transverse direction;

each one of said plurality of said bonding channel windows has a center, a length in said longitudinal direction of said semiconductor chip, wherein said length has an end, an edge disposed remote from said center at said end, and a width;

said width of each one of said plurality of said bonding channel windows increases from said center of said one of said plurality of said bonding windows to said edge of said one of said plurality of said bonding windows in dependence upon a ratio of a first distance to a second distance;

said first distance being a distance from a furthest one of said plurality of said contact bumps to said center of said one of said bonding channel windows; and said second distance being a distance from a nearest one of said plurality of said contact bumps to said center of said one of said bonding channel windows.

12. The electronic device according to claim 1, comprising a plurality of solder balls forming said plurality of said contact bumps.

13. The electronic device according to claim 1, wherein:

said contact connecting lugs of said plurality of said flat conductors have a coating made of a gold alloy; and said plurality of said contact areas of said semiconductor chip are composed of an aluminum alloy.

14. The electronic device according to claim 1, wherein said contact connecting lugs of said plurality of said flat conductors are ultrasonically bonded to said plurality of said contact areas of said semiconductor chip.

* * * * *